(12) United States Patent
Du et al.

(10) Patent No.: US 11,189,740 B2
(45) Date of Patent: Nov. 30, 2021

(54) PHOTOELECTRIC SENSOR AND MANUFACTURING METHOD THEREOF

(71) Applicant: BOE TECHNOLOGY GROUP CO., LTD., Beijing (CN)

(72) Inventors: Jianhua Du, Beijing (CN); Chao Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 75 days.

(21) Appl. No.: 16/819,833

(22) Filed: Mar. 16, 2020

(65) Prior Publication Data

US 2021/0151615 A1   May 20, 2021

(30) Foreign Application Priority Data

Nov. 20, 2019  (CN) .......................... 201911141965.1

(51) Int. Cl.
| | | |
|---|---|---|
| H01L 31/0352 | (2006.01) | |
| H01L 31/032 | (2006.01) | |
| H01L 31/0216 | (2014.01) | |
| H01L 31/0272 | (2006.01) | |
| H01L 31/20 | (2006.01) | |

(52) U.S. Cl.
CPC ...... *H01L 31/0322* (2013.01); *H01L 31/0272* (2013.01); *H01L 31/02161* (2013.01); *H01L 31/0352* (2013.01); *H01L 31/20* (2013.01)

(58) Field of Classification Search
None
See application file for complete search history.

(56) References Cited

U.S. PATENT DOCUMENTS

| | | | |
|---|---|---|---|
| 5,439,533 A | | 8/1995 | Saito et al. |
| 8,962,978 B2* | | 2/2015 | Korevaar .......... H01L 31/03762 136/255 |
| 2003/0103539 A1 | | 6/2003 | Omi et al. |
| 2005/0062041 A1* | | 3/2005 | Terakawa ............ H01L 31/0747 257/53 |
| 2011/0180894 A1 | | 7/2011 | Samuelson et al. |
| 2015/0139398 A1 | | 5/2015 | Tajima et al. |
| 2018/0122963 A1* | | 5/2018 | Xu ...................... H01L 31/0747 |
| 2018/0198002 A1* | | 7/2018 | Lee ..................... H01L 31/1868 |

(Continued)

FOREIGN PATENT DOCUMENTS

| | | |
|---|---|---|
| CN | 102144298 A | 8/2011 |
| CN | 103367516 A | 10/2013 |
| CN | 104602607 B | 4/2017 |

(Continued)

*Primary Examiner* — Benjamin P Sandvik
(74) *Attorney, Agent, or Firm* — The Webb Law Firm (57) ABSTRACT

The embodiment of the application discloses a photoelectric sensor and a manufacturing method thereof, wherein the photoelectric sensor comprises: a light absorbing layer for absorbing incident light to generate a photocurrent, the light absorption layer comprises a first absorption layer and a second absorption layer stacked in the direction of incident light, the first absorption layer being an intrinsic semiconductor layer of the photoelectric sensor, the second absorption layer being made of a material having a higher photoelectric conversion efficiency than the first absorption layer, and the second absorption layer has a stripe structure arranged at intervals.

19 Claims, 9 Drawing Sheets

(56) References Cited

U.S. PATENT DOCUMENTS

2018/0198005 A1 7/2018 Siegmund et al.

FOREIGN PATENT DOCUMENTS

| CN | 106847952 A | 6/2017 |
| CN | 107924934 A | 4/2018 |
| EP | 2284895 A2 | 2/2011 |
| TW | 388143 B | 4/2000 |

\* cited by examiner

Forming a light absorption layer on a side of a substrate, the light absorption layer including a first absorption layer and a second absorption layer stacked in a direction of incident light, the first absorption layer being an intrinsic semiconductor layer of the photoelectric sensor, the second absorption layer being made of a material having a higher photoelectric conversion efficiency than the first absorption layer, and the second absorption layer being formed in a stripe structure arranged at intervals ∼1200

PHOTOELECTRIC SENSOR AND MANUFACTURING METHOD THEREOF

CROSS-REFERENCE TO RELATED APPLICATION

The present application claims the priority to the Chinese patent application No. 201911141965.1 filed on Nov. 20, 2019, the disclosure of which is hereby incorporated herein by reference in its entirety.

TECHNICAL FIELD

The embodiment of the application relates to a photoelectric sensor and a manufacturing method thereof.

BACKGROUND

In recent years, display devices have been made to integrate photoelectric sensors to implement various functions, such as: light sensing, biological information detection and human-machine interaction. For example, smart phones typically include a fingerprint sensor to detect and identify a user's fingerprint.

SUMMARY

The embodiment of the application provides a photoelectric sensor. The photoelectric sensor includes a light absorbing layer for absorbing incident light to generate a photocurrent, the light absorption layer comprises a first absorption layer and a second absorption layer stacked in the direction of incident light, the first absorption layer being an intrinsic semiconductor layer of the photoelectric sensor, the second absorption layer being made of a material having a higher photoelectric conversion efficiency than the first absorption layer, and the second absorption layer has a stripe structure arranged at intervals.

Optionally, the photoelectric sensor further comprises a substrate, a first electrode, a P-type semiconductor layer, an N-type semiconductor layer, and a second electrode, wherein: the first electrode, the P-type semiconductor layer, the light absorption layer, the N-type semiconductor layer and the second electrode are sequentially stacked on a side of the substrate.

Optionally, the photoelectric sensor further comprises a protective layer, wherein the protective layer is positioned at any one of:

the protective layer is arranged on a first side surface and a second side surface of the P-type semiconductor layer, the first absorption layer and the N-type semiconductor layer, and the first side surface and the second side surface are oppositely arranged and are vertical to the surface of the substrate; or the protective layer is on a first side surface and a second side surface of P type semiconductor layer, the first absorption layer and the N type semiconductor layer, and further on a side of the N type semiconductor layer away from the substrate, wherein, the protective layer is provided with a through-hole, such that the second electrode extends through the through-hole.

Optionally, the photoelectric sensor further comprising a window layer located between the N-type semiconductor layer and the second electrode and collecting charges from the light absorbing layer from the N-type semiconductor layer.

Optionally, the first absorber layer comprises a first intrinsic semiconductor layer and a second intrinsic semiconductor layer, the second absorber layer is disposed between the first intrinsic semiconductor layer and the second intrinsic semiconductor layer.

Optionally, the second absorbing layer is disposed on a side of the first absorbing layer.

Optionally, the photoelectric sensor further comprises a buffer layer, wherein the buffer layer is disposed between the substrate and the first electrode.

Optionally, the photoelectric sensor further comprises a substrate, a P-type semiconductor layer, an N-type semiconductor layer, a first electrode, and a second electrode, wherein:

the first absorption layer and the second absorption layer are sequentially stacked on a side of the substrate;

the P-type semiconductor layer is arranged on a first side surface of the first absorption layer and the second absorption layer, the N-type semiconductor layer is arranged on a second side surface of the first absorption layer and the second absorption layer, and the first side surface and the second side surface are oppositely arranged and are vertical to a surface of the substrate;

the first electrode is connected with the P-type semiconductor layer, and the second electrode is connected with the N-type semiconductor layer.

Optionally, the second absorber layer is disposed between the substrate and the first absorber layer.

Optionally, the second absorbing layer is disposed on a side of the first absorbing layer away from the substrate.

Optionally, the second absorption layer comprises a first sub-absorption layer and a second sub-absorption layer, wherein:

the first sub-absorber layer is disposed between the substrate and the first absorber layer;

the second sub-absorption layer is arranged on a side of the first absorption layer away from the substrate;

orthographic projections of the first sub-absorption layer and the second sub-absorption layer on the substrate are staggered and do not overlap with each other.

Optionally, the second absorber layer is made of copper indium gallium selenide.

The embodiment of the application further provides a manufacturing method of the photoelectric sensor, which comprises the following steps: forming a light absorption layer on a side of a substrate, the light absorption layer including a first absorption layer and a second absorption layer stacked in a direction of incident light, the first absorption layer being an intrinsic semiconductor layer of the photoelectric sensor, the second absorption layer being made of a material having a higher photoelectric conversion efficiency than the first absorption layer, and the second absorption layer being formed in a stripe structure arranged at intervals.

Optionally, forming a light absorbing layer on a side of the substrate includes one of:

sequentially stacking the first absorption layer and the second absorption layer on the side of the substrate in the direction of the incident light;

sequentially stacking a second absorption layer and a first absorption layer on the side of the substrate in the direction of the incident light;

sequentially stacking a first intrinsic semiconductor layer, a second absorption layer and a second intrinsic semiconductor layer on the side of the substrate in the direction of the incident light, wherein the first intrinsic absorption layer and the second intrinsic absorption layer constitute the first absorption layer; or sequentially stacking a first sub-absorption layer, the first absorption layer and a second sub-absorption layer on the side of the substrate in the direction of the incident light, wherein the first sub-absorption layer and the second sub-absorption layer constitute the second absorption layer, and orthographic projections of the first sub-absorption layer and the second sub-absorption layer on the substrate are staggered and do not overlap with each other.

Optionally, prior to the step of forming the light absorbing layer, the method further comprises:

forming a first electrode on the side of the substrate;

forming a P-type semiconductor layer on a side of the first electrode away from the substrate;

after the step of forming the light absorbing layer, the method further includes:

forming an N-type semiconductor layer on a side of the light absorption layer away from the substrate; and forming a second electrode on a side of the N-type semiconductor layer away from the substrate.

Optionally, the method further comprises prior to the step of forming the second electrode, forming a window layer on a side of the N-type semiconductor layer away from the substrate, the window layer is configured to collect charge from the light absorbing layer from the N-type semiconductor layer.

Optionally, the method further comprises prior to the step of forming the second electrode, forming a protective layer, the protective layer being positioned at any one of:

the protective layer is arranged on a first side surface and a second side surface of the P-type semiconductor layer, the first absorption layer and the N-type semiconductor layer, and the first side surface and the second side surface are oppositely arranged and are vertical to the surface of the substrate; or the protective layer is on a first side surface and a second side surface of P type semiconductor layer, the first absorption layer and the N type semiconductor layer, and further on a side of the N type semiconductor layer away from the substrate, wherein the protective layer is provided with a through-hole, such that the second electrode extends through the through-hole.

Optionally, the method further comprises:

forming a P-type semiconductor layer and a first electrode connected to the P-type semiconductor layer on a first side surface of the light absorption layer; and forming an N-type semiconductor layer and a second electrode connected with the N-type semiconductor layer on the second side surface of the light absorption layer, wherein the first side surface and the second side surface are oppositely arranged and are vertical to the surface of the substrate.

Optionally, the method further comprises forming a protective layer on the light absorbing layer.

Other features and advantages of the present application will be explained in the following description, and become apparent from the description, or be understood by implementing the present application. Other advantages of the present application can be realized and obtained through the solution described in the description and the accompanying drawings.

BRIEF DESCRIPTION OF THE DRAWINGS

The drawings are intended to provide an understanding of the present disclosure, and are to be considered as forming a part of the specification, and are to be used together with the embodiments of the present disclosure to explain the present disclosure without limiting the present disclosure.

DETAILED DESCRIPTION

In order to make the purpose, technical solution, and advantages of the present application more clear, embodiments of the present application will be described in detail below with reference to the accompanying drawings. It should be noted that, in the case of no conflict, the embodiments in the present application and the features in the embodiments can be arbitrarily combined with each other.

Unless otherwise defined, the technical terms or scientific terms disclosed in the embodiments of the present application shall have the ordinary meanings understood by those with ordinary skills in the field to which this application belongs. "Include" or "Comprise" and similar words mean that the element or object in front of the word covers the element or object listed after the word and its equivalent without excluding other elements or objects.

Embodiments of the present application provide a photo sensor including a light absorbing layer for absorbing incident light to generate a photocurrent. The light absorbing layer includes a first absorbing layer and a second absorbing layer that are stacked in a direction of incident light. The first absorption layer is an intrinsic semiconductor layer of the photoelectric sensor, the second absorption layer is made of a material having higher photoelectric conversion efficiency than the first absorption layer. Further, the second absorption layer is of a strip-shaped structure arranged at intervals, so that the dark current of the photoelectric sensor is less than or equal to a preset dark current threshold. By providing the second absorption layer made of a material with higher photoelectric conversion efficiency and arranging the second absorption layer into the strip-shaped structure arranged at intervals, the photoelectric sensor can respond to the photocurrent to generate more carrier hole pairs while keeping lower dark current. Thereby, amplification of a photocurrent signal is facilitated, higher photocurrent is provided for a sensing device, and the signal-to-noise ratio of the device is effectively improved.

The first absorption layer includes a first surface and a second surface that are oppositely disposed in a direction of incident light, and the first surface and the second surface extend in a direction perpendicular to the incident light. The first absorption layer and the second absorption layer of the light absorption layer are disposed in a stacked manner in the direction of the incident light, which means that the position of the second absorption layer includes at least one of: within the first absorbent layer; adjacent to the first absorbent layer via the first surface of the first absorbent layer; adjacent to the first absorbent layer via the second surface of the first absorbent layer.

Figure 1:
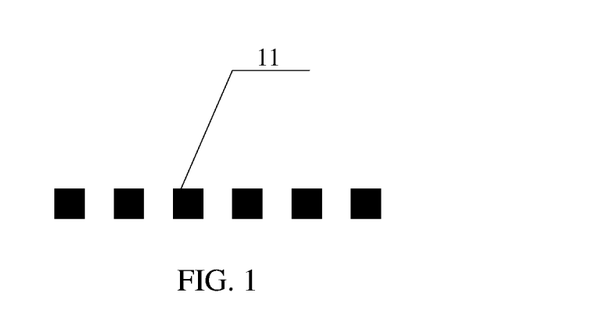
FIG. 1 is a side view of a second absorbent layer provided by embodiments of the present application.
Figure 2:
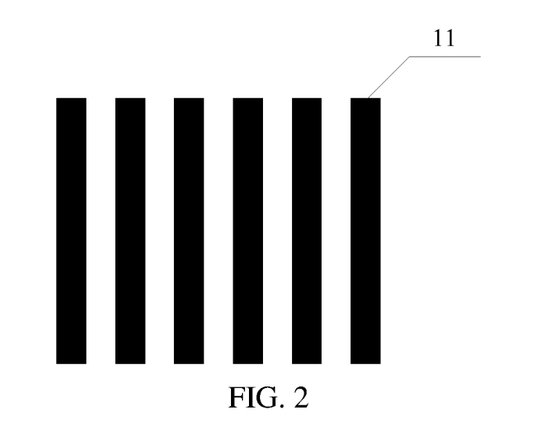
FIG. 2 is a top view of a second absorbent layer provided by embodiments of the present application.

FIG. 1 is a side view of a second absorbent layer provided in embodiments of the present application, and FIG. 2 is a top view of a second absorbent layer provided in embodiments of the present application. As shown in FIG. 1 and FIG. 2, in the embodiment of the present application, the second absorption layer 11 is arranged in a strip structure arranged at intervals, so that the photoelectric sensor can respond to a photocurrent to generate more carrier hole pairs while maintaining a lower dark current level, which is beneficial to amplification of a photocurrent signal.

In some exemplary embodiments of the present application, the stripe structures may be stripe structures arranged at intervals in a regular geometric pattern as shown in FIG. 2 or other stripe structures arranged at intervals in any irregular geometric pattern.

In some exemplary embodiments of the present application, the regular geometric pattern may be rectangular as shown in FIG. 2 or any other geometric shape.

In some exemplary embodiments of the present application, the material of which the second absorption layer 11 is made includes a material with high photoelectric conversion efficiency, such as a material of which a solar cell is made, including a group III-V binary compound semiconductor material (e.g., gallium arsenide), a group III-V binary compound semiconductor material (e.g., cadmium telluride), and a group tri/quaternary compound semiconductor material (e.g., copper indium selenide or copper indium gallium selenide), and the like.

In some exemplary embodiments of the present application, the photoelectric sensor further includes: the semiconductor structure comprises a P-type semiconductor layer and an N-type semiconductor layer, wherein the P-type semiconductor layer, the light absorption layer and the N-type semiconductor layer form a semiconductor junction with a longitudinal structure or a transverse structure.

In some exemplary embodiments of the present application, the P-type semiconductor layer is a P-type amorphous silicon layer, the first absorption layer is an intrinsic amorphous silicon layer, and the N-type semiconductor layer is an N-type amorphous silicon layer.

Because the amorphous silicon (a-Si) PIN sensor has smaller dark current, the embodiment of the application has stronger response capability to light while keeping the lower dark current characteristics of the amorphous silicon PIN sensor, so that the whole photoelectric sensor has higher signal-to-noise ratio and higher detection efficiency.

Figure 3:
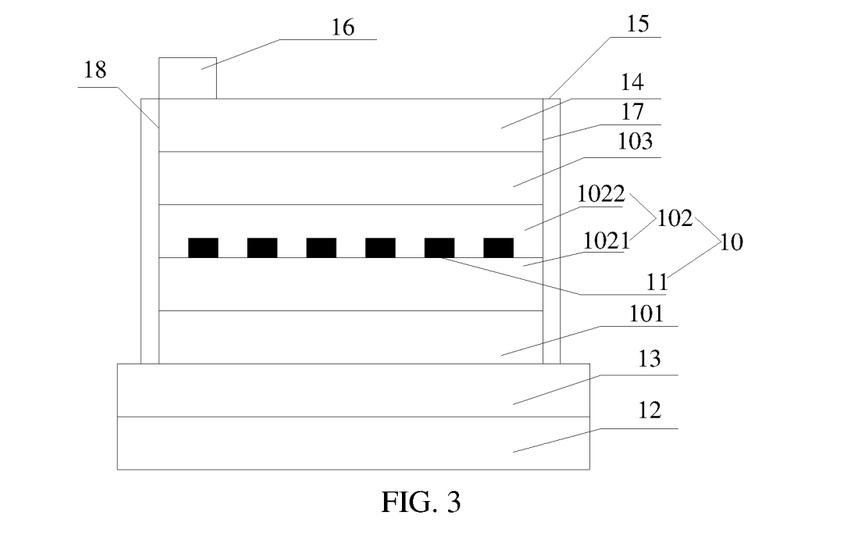
FIG. 3 is a schematic structural diagram of a photoelectric sensor provided in an embodiment of the present application.

As shown in FIG. 3, in some exemplary embodiments of the present application, the P-type semiconductor layer 101, the light absorbing layer 10, and the N-type semiconductor layer 103 constitute a semiconductor junction of a vertical structure. The first absorption layer (i.e., intrinsic semiconductor layer) 102 includes a first intrinsic semiconductor layer 1021 and a second intrinsic semiconductor layer 1022, and the second absorption layer 11 is stacked with the first absorption layer 102 by being interposed between the first intrinsic semiconductor layer 1021 and the second intrinsic semiconductor layer 1022. The photoelectric sensor may further include a substrate 12, a first electrode 13, and a second electrode 16, and the first electrode 13, the P-type semiconductor layer 101, the light absorbing layer 10 (including the first intrinsic semiconductor layer 1021, the second absorption layer 11, and the second intrinsic semiconductor layer 1022), the N-type semiconductor layer 103, and the second electrode 16 are sequentially stacked from bottom to top. In an embodiment according to the present disclosure, the thickness of the second intrinsic semiconductor layer 1022 may be greater than the thickness of the second absorption layer 11 to improve the film forming property of the second intrinsic semiconductor layer 1022.

The photoelectric sensor may further include a window layer 14 between the N-type semiconductor layer 103 and the second electrode 16. The window layer 14 is made of a transparent conductive material (e.g., ITO) so as to collect charges from the light absorbing layer from the N-shaped semiconductor layer 103 and transfer the collected charges to the second electrode 16. Further, the window layer 14 also allows incident light to pass therethrough and enter the light absorbing layer 10. Further, in another embodiment of the present disclosure, the window layer 14 may not be provided, and thus the second electrode 16 is directly in contact with the N-type semiconductor layer 103.

The photoelectric sensor may also include a protective layer 15. The protective layer 15 covers at least the semiconductor junction and the first and second side surfaces 17, 18 of the window layer 14. As shown in FIG. 3, the first side surface 17 and the second side surface 18 are oppositely disposed and perpendicular to the surface of the substrate 12.

In some exemplary embodiments of the present application, the substrate 12 may be made of soda lime glass, quartz glass, sapphire, or the like.

In some exemplary embodiments of the present application, the second electrode 16 is made of ITO or other transparent conductive material. In addition, the second electrode 16 may also be made of an opaque conductive material (e.g., metal). In this case, the second electrode 16 is configured to not substantially obstruct the photosensitive area of the photoelectric sensor.

The embodiment of the present application can prevent the second electrode 16 from overlapping the first side surface 17 or the second side surface 18 of the semiconductor junction during the manufacturing process by making the protective layer 15 cover at least the semiconductor junction and the first side surface 17 and the second side surface 18 of the window layer 14.

Figure 4:
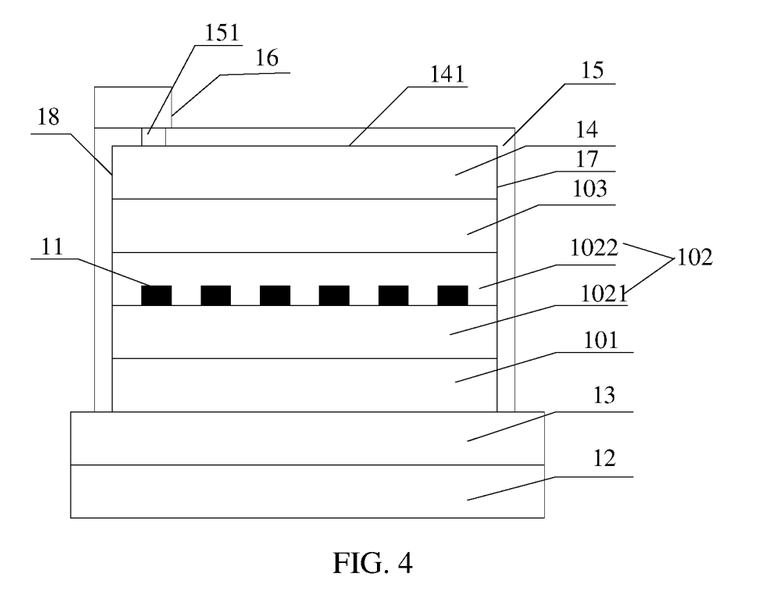
FIG. 4 is a schematic structural diagram of a photoelectric sensor provided in an embodiment of the present application.

As shown in FIG. 4, in some exemplary embodiments of the present application, a protective layer 15 is disposed on a side of the N-type semiconductor layer 14 away from the substrate 12. In FIG. 4, the protective layer 15 covers a surface 141 of the window layer 14 away from the substrate 12.

In this embodiment, the protective layer 15 is provided with a through hole 151, and the second electrode 16 extends through the through hole 151 to connect with the window layer 14. In another embodiment of the present disclosure, the light sensor does not have the window layer 14, and the protective layer 15 is disposed on the N-type semiconductor layer 14.

In this embodiment, the second electrode 16 may be made of molybdenum or the like.

Figure 5:
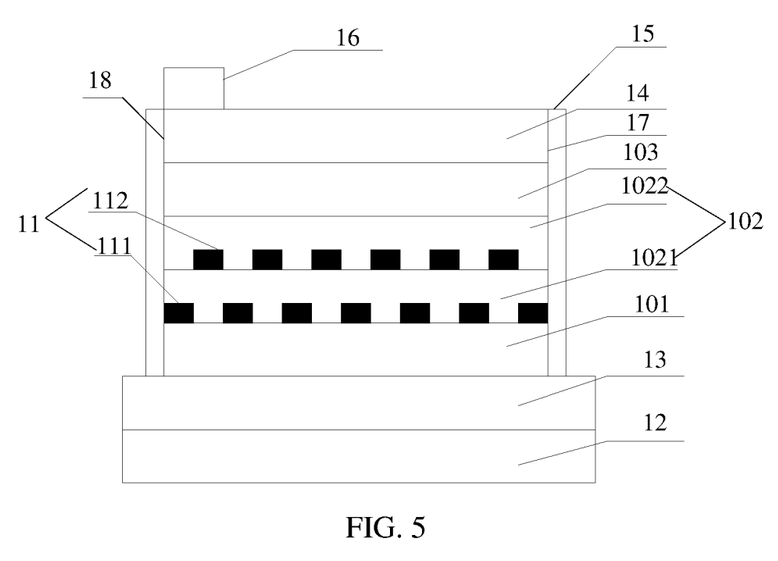
FIG. 5 is a schematic structural diagram of a photoelectric sensor provided in an embodiment of the present application.

As shown in FIG. 5, in some exemplary embodiments of the present application, the second absorption layer 11 includes a first sub-absorption layer 111 and a second sub-absorption layer 112. The first sub-absorption layer 111 is disposed between the first intrinsic semiconductor layer 1021 and the P-type semiconductor layer 101, and the second sub-absorption layer 112 is disposed between the first intrinsic semiconductor layer 1022 and the second intrinsic semiconductor layer 1022. In this embodiment, the first intrinsic semiconductor layer 1021 may have a thickness greater than that of the first sub-absorption layer 111, and the second intrinsic semiconductor layer 1022 may have a thickness greater than that of the second sub-absorption layer 112, thereby improving the film formation properties of the first sub-absorption layer 111 and the second sub-absorption layer 112.

In the present embodiment, as shown in FIG. 5, orthographic projections of the first sub-absorption layer 111 and the second sub-absorption layer 112 on the substrate 12 are staggered and do not overlap each other.

Figure 6:
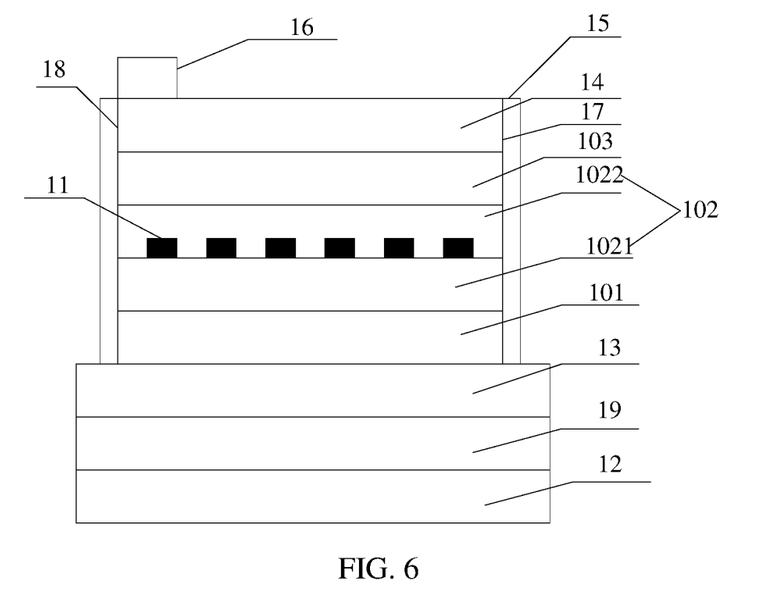
FIG. 6 is a schematic structural diagram of a photoelectric sensor provided in an embodiment of the present application.

As shown in FIG. 6, in some exemplary embodiments of the present application, the photoelectric sensor further includes a buffer layer 19, and the buffer layer 19 is disposed between the substrate 12 and the first electrode 13.

The embodiment of the application can prevent impurities in the substrate 12 from infiltrating into the semiconductor junction by arranging the buffer layer 19. When the material of the substrate 12 is relatively pure, the buffer layer 19 is not required.

Figure 7:
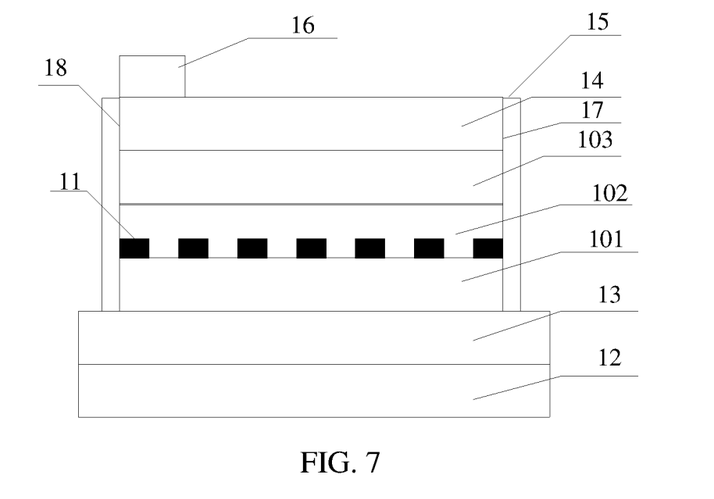
FIG. 7 is a schematic structural diagram of a photoelectric sensor provided in an embodiment of the present application.

As shown in FIG. 7, in some exemplary embodiments of the present application, the P-type semiconductor layer 101, the first absorption layer 102, and the N-type semiconductor layer 103 constitute a semiconductor junction of a vertical structure. The photoelectric sensor further includes a substrate 12, a first electrode 13, and a second electrode 16, and the first electrode 13, the P-type semiconductor layer 101, the second absorption layer 11, the first absorption layer (i.e., intrinsic semiconductor layer) 102, the N-type semiconductor layer 103, and the second electrode 16 are sequentially stacked on the substrate 12. Thus, the second absorbent layer 11 overlaps the first absorbent layer 102 by being located on a side of the first absorbent layer 102. In embodiments according to the present disclosure, the first absorbent layer 102 may have a thickness greater than that of the second absorbent layer 11 to improve the film forming properties of the first absorbent layer 102.

The protective layer 15 covers at least the semiconductor junction and the first and second side surfaces 17, 18 of the window layer 14, the first and second side surfaces 17, 18 being opposite and perpendicular to the surface of the substrate 12.

Figure 8:
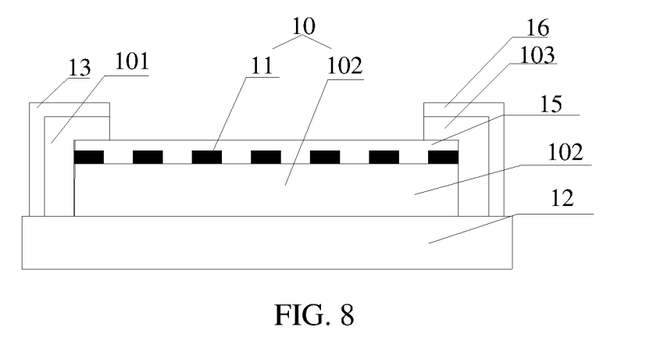
FIG. 8 is a schematic structural diagram of a photoelectric sensor provided in an embodiment of the present application.

As shown in FIG. 8, in some exemplary embodiments of the present application, the P-type semiconductor layer 101, the light absorbing layer 10, and the N-type semiconductor layer 103 constitute a lateral-structured semiconductor junction. Specifically, as shown in FIG. 8, a first absorption layer 102 and a second absorption layer are sequentially stacked on a substrate 12, and a P-type semiconductor layer 101 and an N-type semiconductor layer 103 are located on both sides of the first absorption layer 102 and the second absorption layer 11 in a lateral direction of the substrate 12, thereby forming a lateral semiconductor junction. That is, the P-type semiconductor layer 101 is disposed on a first side surface of the first absorption layer 102 and the second absorption layer 11, and the N-type semiconductor layer is disposed on a second side surface of the first absorption layer 102 and the second absorption layer 11, in which the first side surface and the second side surface are disposed opposite to each other and perpendicular to the surface of the substrate. Further, the photoelectric sensor includes a first electrode 13 and a second electrode 16. The first electrode 13 is connected to the P-type semiconductor layer 101, and the second electrode 16 is connected to the N-type semiconductor layer 103.

In addition, the photoelectric sensor further includes a protective layer 15. The protective layer 15 covers the second absorption layer 11 on the substrate 12. In the embodiments of the present disclosure, the thickness of the protective layer 15 may be greater than the thickness of the second absorption layer 11, thereby improving the film formability of the protective layer 15.

Figure 9:
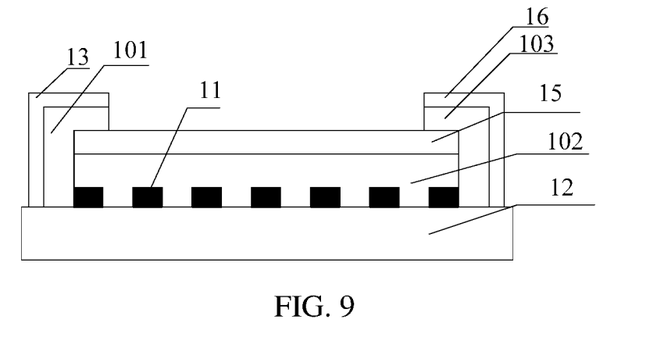
FIG. 9 is a schematic structural diagram of a photoelectric sensor provided in an embodiment of the present application.

As shown in FIG. 9, in some exemplary embodiments of the present application, the P-type semiconductor layer 101, the light absorbing layer 10, and the N-type semiconductor layer 103 constitute a lateral-structured semiconductor junction.

Specifically, as shown in FIG. 9, the second absorption layer 11 and the first absorption layer 102 and the protective layer 15 are sequentially stacked on the substrate 12, and the P-type semiconductor layer 101 and the N-type semiconductor layer 103 are located on both sides of the first absorption layer 102 and the second absorption layer 11 in the lateral direction of the substrate 12, thereby forming a lateral semiconductor junction.

Further, the photoelectric sensor includes a first electrode 13 and a second electrode 16. The first electrode 13 is connected to the P-type semiconductor layer 101, and the second electrode 16 is connected to the N-type semiconductor layer 103.

In the embodiments of the present disclosure, the first absorbent layer 102 has a thickness greater than the second absorbent layer 11, thereby improving the film formability of the first absorbent layer 102.

Figure 10:
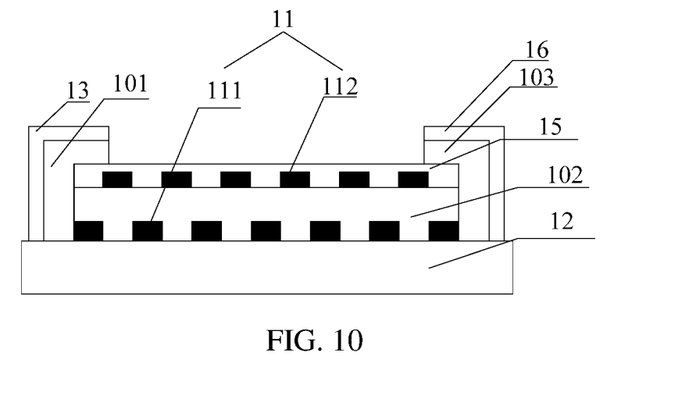
FIG. 10 is a schematic structural diagram of a photoelectric sensor provided in an embodiment of the present application.

As shown in FIG. 10, in some exemplary embodiments of the present application, the P-type semiconductor layer 101, the light absorbing layer 10, and the N-type semiconductor layer 103 constitute a lateral-structured semiconductor junction, and the second absorbing layer 11 includes a first sub-absorbing layer 111 and a second sub-absorbing layer 112. Specifically, as shown in FIG. 10, a first sub-absorption layer 111, a first absorption layer 102, and a second sub-absorption layer 112 are sequentially stacked on a substrate 12, and a P-type semiconductor layer 101 and an N-type semiconductor layer 103 are located on both sides of the first absorption layer 102 and the second absorption layer 11 in a lateral direction of the substrate 12, thereby forming a lateral semiconductor junction. In addition, in the present embodiment, orthographic projections of the first sub-absorption layer 111 and the second sub-absorption layer 112 on the substrate 12 may be staggered and not overlap each other.

In addition, the photoelectric sensor further includes a protective layer 15. The protective layer 15 covers the second absorption layer 11 on the substrate 12. In the embodiments of the present disclosure, the thickness of the first absorption layer 102 may be greater than that of the first sub-absorption layer 111, and the thickness of the protection layer 15 may be greater than that of the second sub-absorption layer 112, thereby improving the film formability of the first absorption layer 102 and the protection layer 15.

Further, the photoelectric sensor includes a first electrode 13 and a second electrode 16. The first electrode 13 is connected to the P-type semiconductor layer 101, and the second electrode 16 is connected to the N-type semiconductor layer 103.

Figure 11:
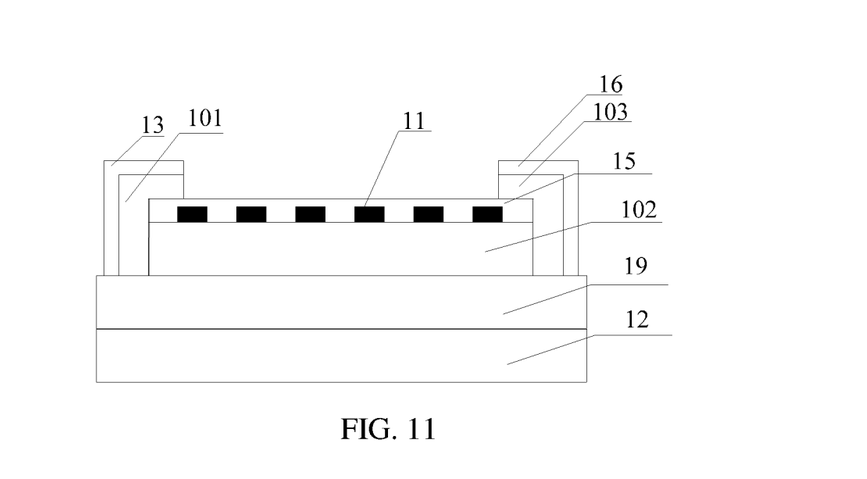
FIG. 11 is a schematic structural diagram of a photoelectric sensor according to an embodiment of the present application.

In some exemplary embodiments of the present application, as shown in FIG. 11, the photoelectric sensor further includes a buffer layer 19, and the buffer layer 19 is disposed between the substrate 12 and the light absorbing layer 10.

In some exemplary embodiments of the present application, the buffer layer 19 is made of silicon nitride (SiN), silicon oxide (SiO), silicon oxynitride (SiON), or the like.

In some exemplary embodiments of the present application, the protective layer 15 is made of silicon nitride (SiN), silicon oxide (SiO), silicon oxynitride (SiON), or the like.

Figure 12:
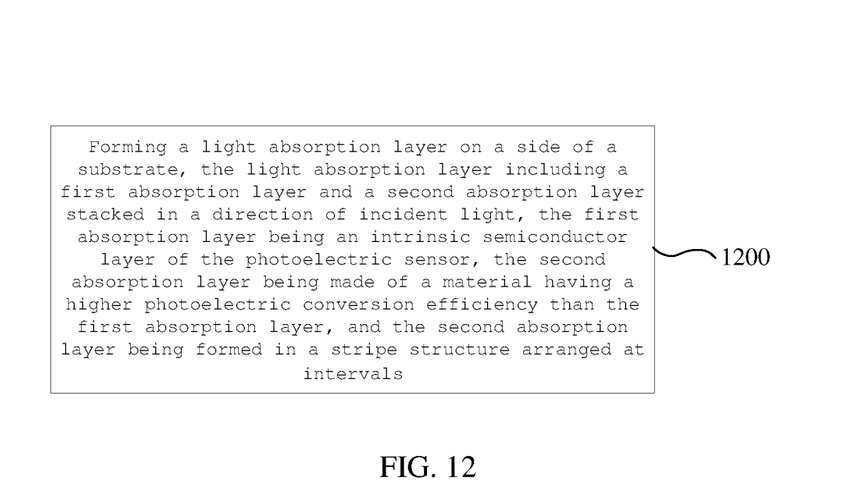
FIG. 12 is a schematic structural diagram of a photoelectric sensor according to an embodiment of the present application.

Based on the inventive concept of the foregoing embodiment, the embodiment of the present application further provides a manufacturing method of the photoelectric sensor. As shown in FIG. 12, the manufacturing method specifically includes the following steps:

forming a light absorption layer on a side of a substrate, the light absorption layer including a first absorption layer and a second absorption layer stacked in a direction of incident light, the first absorption layer being an intrinsic semiconductor layer of the photoelectric sensor, the second absorption layer being made of a material having a higher photoelectric conversion efficiency than the first absorption layer, and the second absorption layer being formed in a stripe structure arranged at intervals.

In some exemplary embodiments of the present application, the method of making further comprises the steps of:

forming a P-type semiconductor layer and an N-type semiconductor layer, wherein the P-type semiconductor layer, the light absorption layer (comprising the first absorption layer and the second absorption layer) and the N-type semiconductor layer form a semiconductor junction with a longitudinal structure or a transverse structure.

Figure 13:
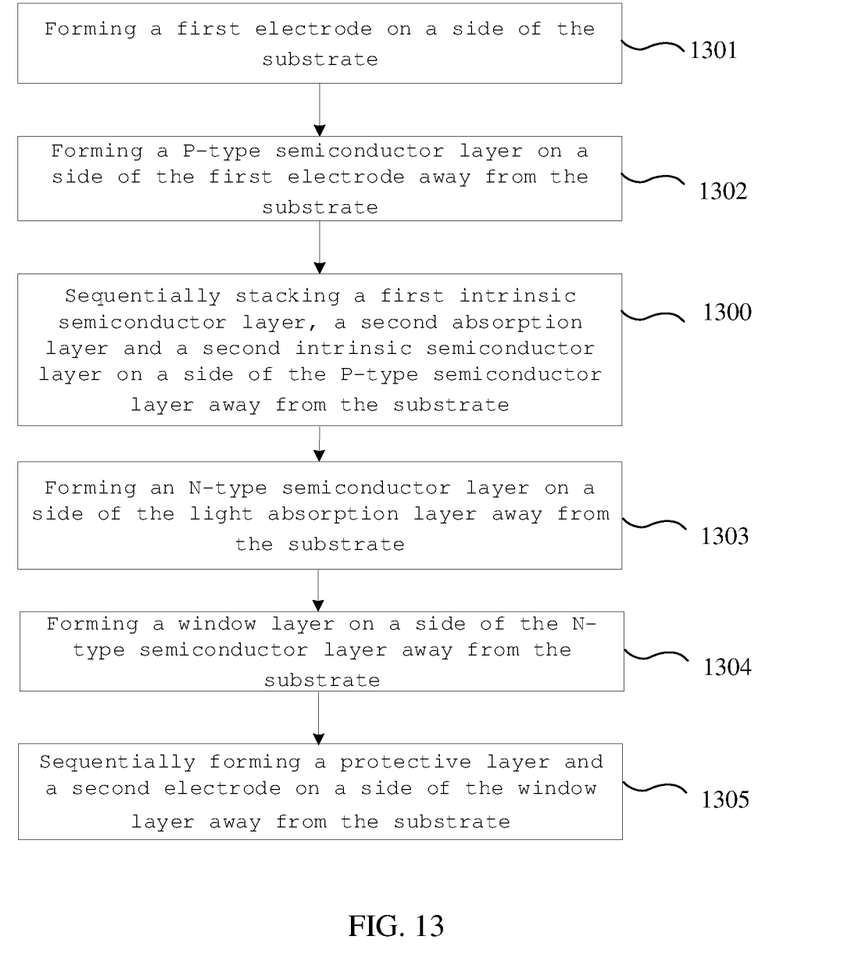
FIG. 13 is a schematic structural diagram of a photoelectric sensor according to an embodiment of the present application.

Based on the inventive concept of the foregoing embodiment, the embodiment of the present application further provides a manufacturing method of the photoelectric sensor. FIG. 13 is a schematic flowchart of a method for manufacturing a photoelectric sensor according to an embodiment of the present application, which corresponds to the photoelectric sensor described in FIG. 3 above, wherein the first absorption layer includes a first intrinsic semiconductor layer and a second intrinsic semiconductor layer. As shown in FIG. 13, the manufacturing method specifically includes the following steps.

First, in step 1301, a first electrode is formed on a side of a substrate. The side of the substrate here refers to the side of the substrate on which the device structures are formed, and is also the side mentioned above on which the light absorbing layer is formed. The sides of the substrates referred to hereinafter are all the same side of the substrate and will not be described again.

In some exemplary embodiments of the present application, step 1301 comprises:

forming a buffer layer on a side of a substrate; and
forming a first electrode on a side of the buffer layer away from the substrate.

Thereafter, in step 1302, a P-type semiconductor layer is formed on a side of the first electrode away from the substrate.

Thereafter, in step 1300, a step of forming a light absorbing layer on a side of the substrate is performed. Specifically, in an embodiment of the present disclosure, the first absorption layer includes a first intrinsic semiconductor layer and a second intrinsic semiconductor layer. Therefore, step 1300 specifically includes the following steps: sequentially stacking a first intrinsic semiconductor layer, a second absorption layer and a second intrinsic semiconductor layer on a side of the P-type semiconductor layer away from the substrate, wherein the second absorption layer is in a strip structure arranged at intervals.

In the embodiment of the present application, the first intrinsic semiconductor layer may play have a function of protecting the P-type semiconductor layer.

In some exemplary embodiments of the present application, the second absorption layer is formed by a mask evaporation method.

In an embodiment according to the present disclosure, the second intrinsic semiconductor layer may have a thickness greater than that of the second absorber layer to improve film formation properties of the second intrinsic semiconductor layer.

Thereafter, in step 1303, an N-type semiconductor layer is formed on a side of the light absorbing layer (i.e., the second intrinsic semiconductor layer) away from the substrate. In this embodiment, the P-type semiconductor layer, the light absorbing layer, and the N-type semiconductor layer constitute a semiconductor junction of a vertical structure.

Thereafter, in step 1304, a window layer is formed on a side of the N-type semiconductor layer away from the substrate.

In some exemplary embodiments of the present application, the window layer is made of Indium Tin Oxide (ITO) or other transparent conductive material.

Thereafter, in step 1305, a protective layer and a second electrode are sequentially formed on the side of the window layer away from the substrate.

In some exemplary embodiments of the present application, the protective layer covers the semiconductor junction and the first and second side surfaces of the window layer, which are perpendicular to the surface of the substrate.

According to the embodiment of the application, the protective layer at least covers the first side surface and the second side surface of the semiconductor junction and the window layer, so that the second electrode can be prevented from being contacted with the first side surface or the second side surface of the semiconductor junction in the manufacturing process.

When the protective layer only covers the semiconductor junction and the first side surface and the second side surface of the window layer, the second electrode and the window layer can be made of ITO or other transparent conductive materials, and the second electrode and the window layer can be formed at the same time.

In some exemplary embodiments of the present application, the protective layer covers the first and second side surfaces of the semiconductor junction and the window layer, the first and second side surfaces being perpendicular to the surface of the substrate, the protective layer also covers the surface of the window layer away from the substrate. At this time, a protective layer is firstly formed, then a through hole is formed on the protective layer, and a second electrode is formed later, and the second electrode is connected with the window layer through the through hole. At this time, the manufacturing material of the window layer may be indium tin oxide ITO or other transparent conductive materials, and the manufacturing material of the second electrode may be metal molybdenum, etc.

According to an embodiment of the present disclosure, both the window layer and the protective layer are optional, and the photoelectric sensor according to the present disclosure may not have at least one of the window layer and the protective layer.

Figure 14:
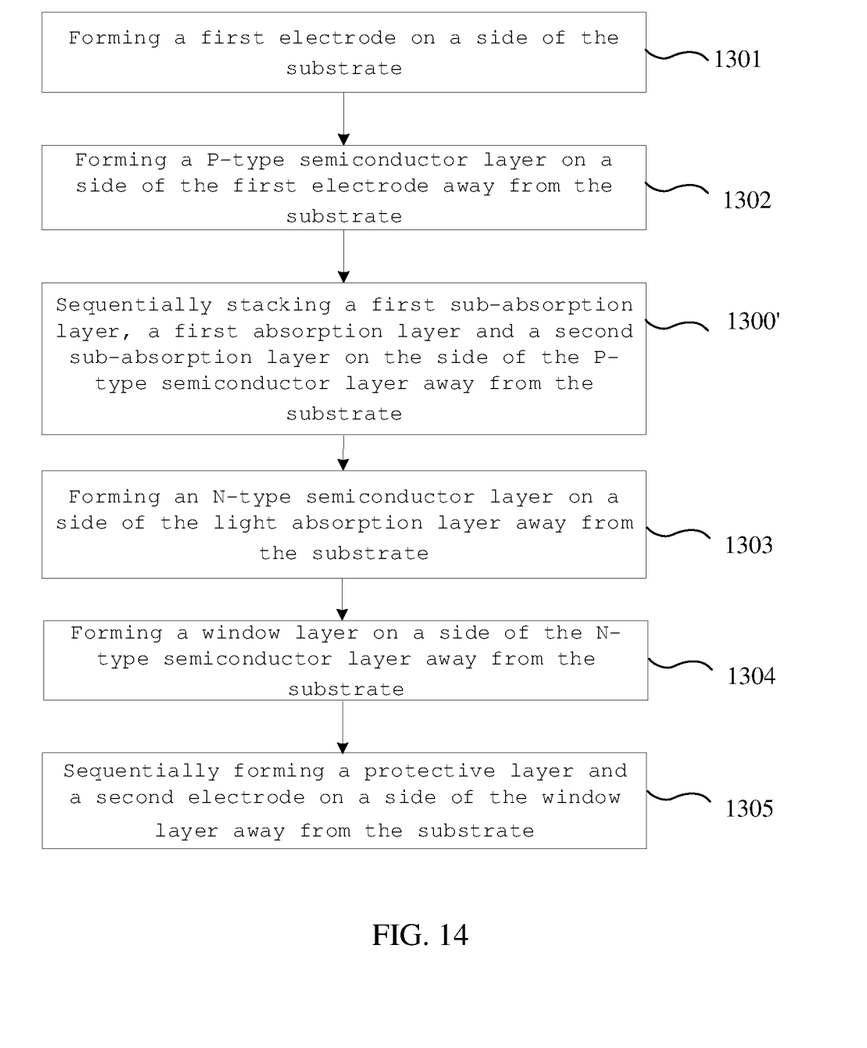
FIG. 14 is a schematic structural diagram of a photoelectric sensor according to an embodiment of the present application.

In some exemplary embodiments of the present application, as shown in FIG. 5, the second absorption layer includes a first sub-absorption layer and a second sub-absorption layer. In this case, step 1300 in FIG. 13 may be changed to step 1300' in FIG. 14.

in step 1300', a first sub-absorption layer, a first absorption layer and a second sub-absorption layer are sequentially stacked on the side of the substrate in the direction of the incident light, the first sub-absorption layer and the second sub-absorption layer constitute the second absorption layer, and orthographic projections of the first sub-absorption layer and the second sub-absorption layer on the substrate are staggered and do not overlap with each other.

In this embodiment, the first intrinsic semiconductor layer may have a thickness greater than that of the first sub-absorber layer, and the second intrinsic semiconductor layer may have a thickness greater than that of the second sub-absorber layer thickness, thereby improving the film formation properties of the first sub-absorber layer and the second sub-absorber layer.

Figure 15:
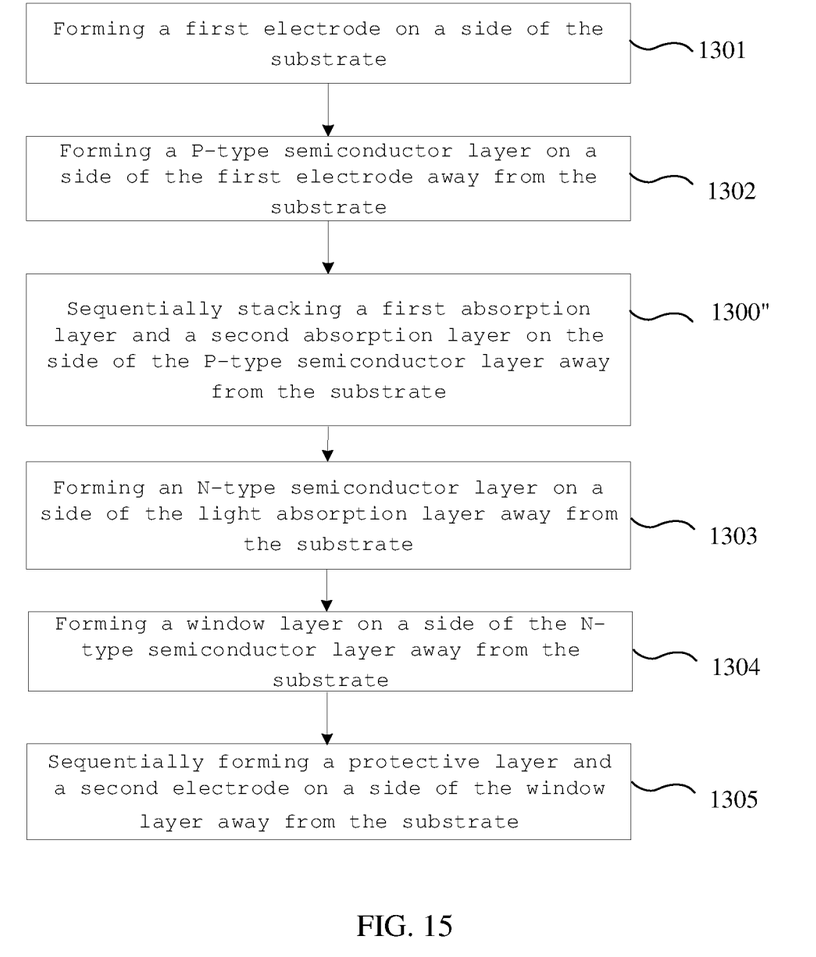
FIG. 15 is a schematic structural diagram of a photoelectric sensor according to an embodiment of the present application.

In some exemplary embodiments of the present application, as shown in FIG. 7, the second absorption layer and the first absorption layer are sequentially formed on a side of the substrate in the direction of the incident light, that is, the second absorption layer is firstly formed, and then the first absorption layer is formed. In this case, step 1300 in FIG. 13 may be changed to step 1300'' in FIG. 15.

in step 1300'', a second absorption layer and a first absorption layer are sequentially stacked on a side of the substrate in the direction of incident light.

In addition, in another embodiment of the present disclosure, the first absorption layer and the second absorption layer may be sequentially formed on a side of the substrate in the direction of the incident light, that is, the first absorption layer is firstly formed, and then the second absorption layer is formed. In this embodiment, the above step 1300 may be changed to sequentially form the first absorption layer and the second absorption layer in a stacked manner on a side of the substrate in the direction of the incident light, and a detailed description thereof will not be given here.

Figure 16:
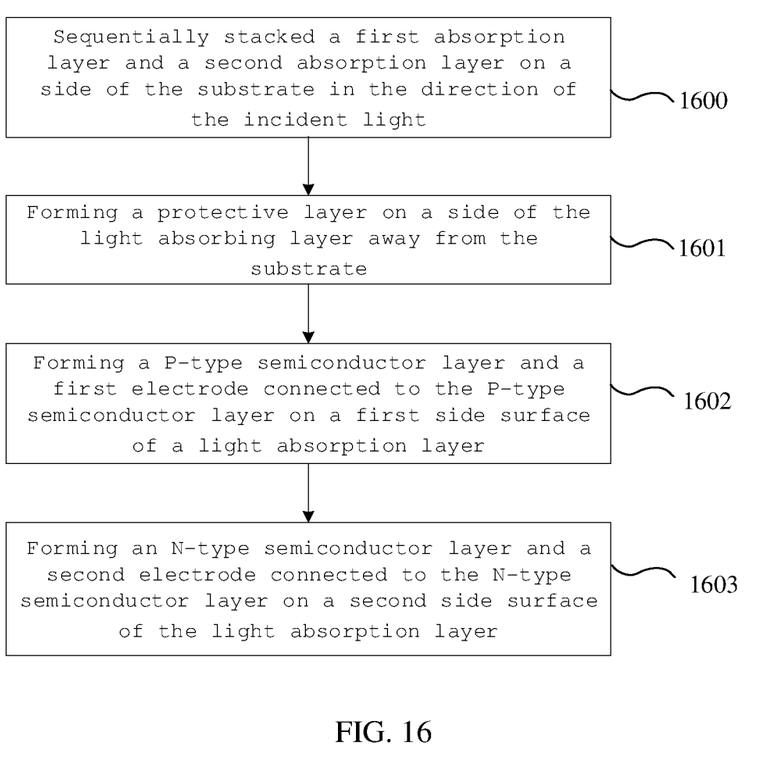
FIG. 16 is a schematic structural diagram of a photoelectric sensor according to an embodiment of the present application.

Based on the inventive concept of the foregoing embodiment, the embodiment of the present application further provides a manufacturing method of the photoelectric sensor. In the present embodiment, as shown in FIG. 8, the P-type semiconductor layer, the light absorbing layer, and the N-type semiconductor layer constitute a semiconductor junction of a lateral structure. FIG. 16 is a schematic flowchart of a manufacturing method of a photoelectric sensor according to an embodiment of the present application. As shown in FIG. 16, the manufacturing method specifically includes the following steps.

In step 1600, a first absorption layer and a second absorption layer are sequentially stacked on a side of the substrate in the direction of the incident light, where the second absorption layer is a strip-shaped structure arranged at intervals.

In some exemplary embodiments of the present application, the second absorption layer is formed by a mask evaporation method.

In some exemplary embodiments of the present application, step 1600 comprises:

forming a buffer layer on a side of a substrate; and forming a light absorption layer on the side of the buffer layer away from the substrate.

Step 1600 may also be changed to other steps of forming a light absorbing layer, similar to the description made above for steps 1300, 1300', and 1300'', depending on the configuration of the first and second light absorbing layers. Thus, in several embodiments according to the present disclosure, step 1600 can include one of:

sequentially stacking the first absorption layer and the second absorption layer on the side of the substrate in the direction of the incident light;

sequentially stacking a second absorption layer and a first absorption layer on the side of the substrate in the direction of the incident light;

sequentially stacking a first intrinsic semiconductor layer, a second absorption layer and a second intrinsic semiconductor layer on the side of the substrate in the direction of the incident light, wherein the first intrinsic absorption layer and the second intrinsic absorption layer constitute the first absorption layer; and sequentially stacking a first sub-absorption layer, the first absorption layer and a second sub-absorption layer on the side of the substrate in the direction of the incident light, wherein the first sub-absorption layer and the second sub-absorption layer constitute the second absorption layer, and orthographic projections of the first sub-absorption layer and the second sub-absorption layer on the substrate are staggered and do not overlap with each other.

For clarity and ease of understanding, the above description of step 1600 is not repeated in detail.

Thereafter, in step 1601, a protective layer is formed on a side of the light absorbing layer away from the substrate.

In embodiments of the present disclosure, the thickness of the protective layer may be greater than the thickness of the second absorbing layer, thereby improving the film formability of the protective layer.

Then, in step 1602, a P-type semiconductor layer and a first electrode connected to the P-type semiconductor layer are formed on a first side surface of a light absorption layer, and in step 1602, an N-type semiconductor layer and a second electrode connected to the N-type semiconductor layer are formed on a second side surface of the light absorption layer, the first side surface and the second side b surface being opposite to each other and perpendicular to the surface of the substrate.

In the description of the embodiments of the present application, it should be understood that that the directions or positional relations indicated by the terms "middle", "upper", "lower", "front", "rear", "vertical", "horizontal", "top", and "bottom", "inside" and "outside" are based on the positional or positional relationships shown in the drawings, and are only for the convenience of describing this application and simplifying the description, rather than indicating or implying that the device or element referred to must have a specific orientation and be constructed and operated in a particular orientation, and they cannot be understood as a limitation on the present disclosure.

In the description of the embodiments of the present application, it should be noted that the terms "installation", "connected", and "connected" should be understood in a broad sense unless explicitly stated and limited otherwise. For example, they can be fixed connections or may be detachable connection or integral connection; they can be mechanical connection or electrical connection; they can be directly connection, or it can be indirectly connection through an intermediate medium, or it can be the internal connection of two elements. For those of ordinary skill in the art, the specific meanings of the above terms in this application can be understood in specific situations.

Although the embodiments disclosed in the present application are as described above, the content is only for the implementation of the present application and is not intended to limit the present application. Any person skilled in the art to which this application belongs may make any modifications and changes in the form and details of implementation without departing from the spirit and scope disclosed in this application, but the scope of patent protection for this application must still be determined based on the scope defined by the appended claims.

What is claimed is:

1. A photoelectric sensor including a light absorbing layer for absorbing incident light to generate photocurrent,
    the light absorption layer comprising a first absorption layer and a second absorption layer stacked in the direction of incident light, the first absorption layer being an intrinsic semiconductor layer of the photoelectric sensor, the second absorption layer being made of a material having a higher photoelectric conversion efficiency than the first absorption layer, and
    the second absorption layer having a stripe structure arranged at intervals.

2. The photoelectric sensor of claim 1, wherein the photoelectric sensor further comprises a substrate, a first electrode, a P-type semiconductor layer, an N-type semiconductor layer, and a second electrode, wherein:
    the first electrode, the P-type semiconductor layer, the light absorption layer, the N-type semiconductor layer and the second electrode are sequentially stacked on a side of the substrate.

3. The photoelectric sensor of claim 1, further comprising a protective layer, wherein the protective layer is positioned on any one of:
    a first side surface and a second side surface of the P-type semiconductor layer, the first absorption layer and the N-type semiconductor layer, the first side surface and the second side surface being oppositely arranged and vertical to the surface of the substrate; or
    the first side surface and the second side surface of the P type semiconductor layer, the first absorption layer and the N type semiconductor layer, and further a side of the N type semiconductor layer away from the substrate, wherein, the protective layer is provided with a through-hole, such that the second electrode extends through the through-hole.

4. The photoelectric sensor of claim 1, further comprising a window layer located between the N-type semiconductor layer and the second electrode and collecting charges from the light absorbing layer from the N-type semiconductor layer.

5. The photoelectric sensor of claim 1, wherein the first absorber layer comprises a first intrinsic semiconductor layer and a second intrinsic semiconductor layer, the second absorber layer is disposed between the first intrinsic semiconductor layer and the second intrinsic semiconductor layer.

6. The photoelectric sensor of claim 1, wherein the second absorbing layer is disposed on a side of the first absorbing layer.

7. The photoelectric sensor of claim 2, wherein the photoelectric sensor further comprises a buffer layer, wherein the buffer layer is disposed between the substrate and the first electrode.

8. The photoelectric sensor of claim 1, wherein the photoelectric sensor further comprises a substrate, a P-type semiconductor layer, an N-type semiconductor layer, a first electrode, and a second electrode, wherein:
    the first absorption layer and the second absorption layer are sequentially stacked on a side of the substrate;
    the P-type semiconductor layer is arranged on a first side surface of the first absorption layer and the second absorption layer, the N-type semiconductor layer is arranged on a second side surface of the first absorption layer and the second absorption layer, and the first side surface and the second side surface are oppositely arranged and are vertical to the surface of the substrate;
    the first electrode is connected with the P-type semiconductor layer, and the second electrode is connected with the N-type semiconductor layer.

9. The photoelectric sensor of claim 8, wherein the second absorber layer is disposed between the substrate and the first absorber layer.

10. The photoelectric sensor of claim 8, wherein the second absorbing layer is disposed on a side of the first absorbing layer away from the substrate.

11. The photoelectric sensor of claim 8, wherein the second absorption layer comprises a first sub-absorption layer and a second sub-absorption layer, wherein:
    the first sub-absorber layer is disposed between the substrate and the first absorber layer;
    the second sub-absorption layer is arranged on aside of the first absorption layer away from the substrate;
    orthographic projections of the first sub-absorption layer and the second sub-absorption layer on the substrate are staggered and do not overlap with each other.

12. The photoelectric sensor of claim 1, wherein the second absorber layer is made of copper indium gallium selenide.

13. A method of making a photoelectric sensor, comprising:
    forming a light absorption layer on a side of a substrate, the light absorption layer including a first absorption layer and a second absorption layer stacked in a direction of incident light, the first absorption layer being an intrinsic semiconductor layer of the photoelectric sensor, the second absorption layer being made of a material having a higher photoelectric conversion efficiency than the first absorption layer, and the second absorption layer being formed in a stripe structure arranged at intervals.

14. The method of claim 13, wherein,
    forming a light absorbing layer on a side of the substrate, including one of:
    sequentially stacking the first absorption layer and the second absorption layer on the side of the substrate in the direction of the incident light;
    sequentially stacking a second absorption layer and a first absorption layer on the side of the substrate in the direction of the incident light;

sequentially stacking a first intrinsic semiconductor layer, a second absorption layer and a second intrinsic semiconductor layer on the side of the substrate in the direction of the incident light, wherein the first intrinsic absorption layer and the second intrinsic absorption layer constitute the first absorption layer; or sequentially stacking a first sub-absorption layer, the first absorption layer and a second sub-absorption layer on the side of the substrate in the direction of the incident light, wherein the first sub-absorption layer and the second sub-absorption layer constitute the second absorption layer, and orthographic projections of the first sub-absorption layer and the second sub-absorption layer on the substrate are staggered and do not overlap with each other.

15. The method of claim 13, wherein prior to the step of forming the light absorbing layer, the method further comprises:

forming a first electrode on the side of the substrate;

forming a P-type semiconductor layer on a side of the first electrode away from the substrate;

after the step of forming the light absorbing layer, the method further includes:

forming an N-type semiconductor layer on a side of the light absorption layer away from the substrate; and forming a second electrode on a side of the N-type semiconductor layer away from the substrate.

16. The method of claim 15, further comprising prior to the step of forming the second electrode, forming a window layer on a side of the N-type semiconductor layer away from the substrate, the window layer is configured to collect charge from the light absorbing layer from the N-type semiconductor layer.

17. The method of claim 15, further comprising prior to the step of forming the second electrode, forming a protective layer, the protective layer being positioned on any one of:

a first side surface and a second side surface of the P-type semiconductor layer, the first absorption layer and the N-type semiconductor layer, the first side surface and the second side surface being oppositely arranged and vertical to the surface of the substrate; or the first side surface and the second side surface of the P type semiconductor layer, the first absorption layer and the N type semiconductor layer, and further a side of the N type semiconductor layer away from the substrate, wherein the protective layer is provided with a through-hole, such that the second electrode extends through the through-hole.

18. The method of claim 13, further comprising:

forming a P-type semiconductor layer and a first electrode connected to the P-type semiconductor layer on a first side surface of the light absorption layer; and forming an N-type semiconductor layer and a second electrode connected with the N-type semiconductor layer on the second side surface of the light absorption layer, wherein the first side surface and the second side surface are oppositely arranged and are vertical to the surface of the substrate.

19. The method of claim 18, further comprising forming a protective layer on the light absorbing layer.

* * * * *

UNITED STATES PATENT AND TRADEMARK OFFICE
CERTIFICATE OF CORRECTION

PATENT NO. : 11,189,740 B2
APPLICATION NO. : 16/819833
DATED : November 30, 2021
INVENTOR(S) : Du et al.

Page 1 of 1

It is certified that error appears in the above-identified patent and that said Letters Patent is hereby corrected as shown below:

In the Claims

Column 14, Line 39, Claim 11, delete "aside" and insert -- a side --

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*